United States Patent
Baba et al.

(10) Patent No.: US 12,119,399 B2
(45) Date of Patent: Oct. 15, 2024

(54) SEMICONDUCTOR DEVICE INCLUDING VERTICAL MOSFET AND SCHOTTKY BARRIER DIODE

(71) Applicant: FUJI ELECTRIC CO., LTD., Kawasaki (JP)

(72) Inventors: Masakazu Baba, Matsumoto (JP); Shinsuke Harada, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 303 days.

(21) Appl. No.: 17/558,004

(22) Filed: Dec. 21, 2021

(65) Prior Publication Data

US 2022/0199823 A1    Jun. 23, 2022

(30) Foreign Application Priority Data

Dec. 22, 2020 (JP) .................. 2020-212973

(51) Int. Cl.
*H01L 29/78* (2006.01)
*H01L 29/16* (2006.01)
*H01L 29/66* (2006.01)

(52) U.S. Cl.
CPC ...... *H01L 29/7806* (2013.01); *H01L 29/1608* (2013.01); *H01L 29/7811* (2013.01); *H01L 29/7813* (2013.01); *H01L 29/66734* (2013.01)

(58) Field of Classification Search
CPC ............... H01L 29/0615; H01L 29/086; H01L 29/0878; H01L 29/1608; H01L 29/47;
(Continued)

(56) References Cited

U.S. PATENT DOCUMENTS 5,614,749 A    3/1997 Ueno
2012/0306009 A1* 12/2012 Kim .................... H01L 27/0629
257/334
(Continued)

FOREIGN PATENT DOCUMENTS

JP    H08204179 A    8/1996
JP    2015076592 A   4/2015
(Continued)

OTHER PUBLICATIONS

Japanese Office Action dated Aug. 20, 2024, in the counterpart Japanese Patent Application No. 2020-212973.

*Primary Examiner* — Didarul A Mazumder
(74) *Attorney, Agent, or Firm* — Rabin & Berdo, P.C.

(57) ABSTRACT

A semiconductor device capable of suppressing forward voltage degradation and loss during turn-on. A vertical MOSFET includes a semiconductor substrate of a first conductivity type, a first semiconductor layer of the first conductivity type, a second semiconductor layer of a second conductivity type, first semiconductor regions of the first conductivity type, second semiconductor regions of the second conductivity type, third semiconductor regions of the second conductivity type, first trenches and second trenches, gate electrodes provided in the first trenches via a gate insulating film, and Schottky metal provided in the second trenches. In a region between an active region through which current flows during an on-state and an edge region that surrounds a periphery of the active region and sustains a breakdown voltage, sidewalls of the second trenches are apart from the second semiconductor regions and the third semiconductor regions.

3 Claims, 8 Drawing Sheets

(58) Field of Classification Search
CPC ........... H01L 29/66068; H01L 29/7806; H01L 29/7813; H01L 29/872; H01L 29/66734; H01L 29/7811; H01L 29/0623
USPC .................. 257/288, 330–332, 334; 438/197
See application file for complete search history.

(56) References Cited

U.S. PATENT DOCUMENTS

| | | | |
|---|---|---|---|
| 2018/0301536 A1* | 10/2018 | Utsumi | H01L 21/02529 |
| 2018/0308972 A1 | 10/2018 | Ohse et al. | |
| 2019/0165163 A1* | 5/2019 | Kobayashi | H01L 29/872 |
| 2019/0386095 A1* | 12/2019 | Takeuchi | H01L 29/0878 |
| 2019/0386096 A1* | 12/2019 | Takeuchi | H01L 29/0692 |
| 2019/0386131 A1* | 12/2019 | Takeuchi | H01L 21/02529 |
| 2020/0083369 A1* | 3/2020 | Kobayashi | H01L 29/0623 |

FOREIGN PATENT DOCUMENTS

| | | |
|---|---|---|
| JP | 2018182234 A | 11/2018 |
| JP | 2019102554 A | 6/2019 |
| JP | 2019216223 A | 12/2019 |

* cited by examiner

SEMICONDUCTOR DEVICE INCLUDING VERTICAL MOSFET AND SCHOTTKY BARRIER DIODE

BACKGROUND OF THE INVENTION

1. Field of the Invention

The invention relates to a semiconductor device.

2. Description of the Related Art

Conventionally, in a power semiconductor device element, a vertical MOSFET (metal oxide semiconductor field effect transistor) having a trench structure is fabricated (manufactured) to reduce on-resistance of the device element. Cell density per unit area may be increased to a greater extent with a trench structure in which a channel is formed orthogonal to the substrate surface than in a planar structure in which a channel is formed parallel to the substrate surface and thus, current density per unit area may be increased in a vertical MOSFET, which is advantageous in terms of cost.

A vertical MOSFET has a built-in parasitic pn diode formed, as a body diode between a source and drain, by a p-type base layer and an n-type drift layer. Therefore, a freewheeling diode (FWD) used in an inverter may be omitted, thereby contributing to reductions in cost and size. Nonetheless, in an instance in which a silicon carbide substrate is used as a semiconductor substrate, compared to an instance in which a silicon (Si) substrate is used, the parasitic pn diode has high built-in potential and therefore, the on-resistance of the parasitic pn diode increases, leading to increased loss. Further, in an instance in which the parasitic pn diode turns on and conducts, characteristics change over time (degrade over time) due to bipolar operation of the parasitic pn diode, whereby forward degradation and turn-on loss occur.

In regard to these problems, a Schottky barrier diode (SBD) may be connected in parallel to the MOSFET on the circuit so that current flows to the SBD but not to the parasitic pn diode during freewheeling. Nonetheless, the number of necessary SBD chips is about the same as that for the MOSFET and therefore, cost increases.

Thus, a technique has been proposed in which a contact trench that penetrates through a p-type channel portion is formed at the substrate surface, an SBD is encapsulated by inner walls of the trench, and current during freewheeling passes through the built-in SBD and not a PiN diode (for example, refer to Japanese Laid-Open Patent Publication No. H8-204179 below).

FIG. 13 is a top view depicting a structure of a conventional built-in SBD silicon carbide semiconductor device. FIG. 14 is a cross-sectional view of a portion along C-C' in FIG. 13 depicting the structure of the conventional built-in SBD silicon carbide semiconductor device. As depicted in FIG. 13, a built-in SBD silicon carbide semiconductor device 150 includes an active region 140 in which a device element structure is formed and through which a current passes during an on-state, an edge region 142 that surrounds a periphery of the active region 140 and sustains a breakdown voltage, and a connecting region 141 between the active region 140 and the edge region 142. The active region 140 is a region surrounded by dotted and dashed line in FIG. 13.

Further, as depicted in FIG. 14, a MOS gate of a general trench gate structure is included on a front surface (surface having a later-described p-type base layer 116) side of a semiconductor base containing silicon carbide (hereinafter, silicon carbide base). The silicon carbide base (semiconductor chip) is formed by sequentially growing, epitaxially, silicon carbide layers constituting an $n^-$-type drift layer 101, an n-type region 115 constituting a current spreading region, and the p-type base layer 116, on an $n^+$-type support substrate (hereinafter, $n^+$-type silicon carbide substrate) 102 that contains silicon carbide.

On the $n^+$-type silicon carbide substrate 102, an $n^-$-type layer constituting the $n^-$-type drift layer 101 is epitaxially grown and at a front surface (surface having the $n^-$-type drift layer 101) side of the $n^+$-type silicon carbide substrate 102, a MOS gate structure is provided formed by the p-type base layer 116, $n^+$-type source regions 117, trench gates 131, gate insulating films 119, and gate electrodes 120. Further, reference numerals 118, 121, and 122 are $p^{++}$-type contact regions, an interlayer insulating film, and a source electrode.

In the n-type region 115, first $p^+$-type regions 103 are selectively provided so as to underlie entire areas of bottoms of the trench gates 131. Further, in the n-type region 115, the first $p^+$-type regions 103 are selectively provided so as to underlie entire areas of bottoms of trench SBDs 132. The first $p^+$-type regions 103 are provided at a depth not reaching the $n^-$-type drift layer 101. Further, in the edge region 142, second $p^+$-type regions 104 are provided on an entire area of the surface of each of the first $p^+$-type regions 103.

Further, the trench SBDs 132 have inner walls covered by a Schottky metal 126 connected to the source electrode 122 and are trenches that form Schottky barrier diodes with semiconductor regions exposed at the inner walls and the Schottky metal 126. In this manner, in FIG. 13, a parasitic Schottky diode (built-in SBD) is provided in parallel to a parasitic pn diode with the source and drain.

When positive voltage is applied to the source electrode 122 and negative voltage is applied to a drain electrode (not depicted) provided on a back surface of the $n^+$-type silicon carbide substrate 102 (when the MOSFET is off), a pn junction between the p-type base layer 116 and the $n^-$-type drift layer 101 is forward biased. In FIG. 13, when the MOSFET is off, the parasitic Schottky diode is designed to turn on before the parasitic pn diode turns on, whereby bipolar operation of the parasitic pn diode is inhibited and degradation over time due to bipolar operation may be prevented.

Further, a semiconductor device is commonly known in which an n-type region, a first $p^+$-type region, and a second $p^+$-type region are provided, and in a region facing, in a depth direction, a gate electrode pad that is connected to gate electrodes, the first $p^+$-type region is provided leaving a gap along a direction of a trench gate width, whereby without bipolar operation of a PiN diode up to a current region, forward voltage degradation and loss during turn-on may be reduced (for example, refer to Japanese Laid-Open Patent Publication No. 2019-102554 below).

SUMMARY OF THE INVENTION

To solve the problems below and achieve an object of the present invention, a semiconductor device according to the invention has the following features. On a front surface of a semiconductor substrate of a first conductivity type, a first semiconductor layer of a first conductivity type and having an impurity concentration lower that is than that of the semiconductor substrate is provided. A second semiconductor layer of a second conductivity type is provided on a side of the first semiconductor layer, that is opposite to a side of the first semiconductor layer, that faces the semiconductor substrate. A first semiconductor region of the first conductivity type and having an impurity concentration that is higher than that of the semiconductor substrate are selectively provided in the second semiconductor layer. Second semiconductor regions of the second conductivity type are provided in the first semiconductor layer. Third semiconductor regions of the second conductivity type and having bottoms in contact with the second semiconductor regions are provided in a surface layer of the first semiconductor layer. A first trench and a second trench that penetrate first semiconductor region and the second semiconductor layer and reach the first semiconductor layer are provided, the first and the second trenches having bottoms that are in contact with the second semiconductor regions. A gate electrode is provided in the first trench via a gate insulating film. A Schottky electrode is provided in the second trench. The second trench has sidewalls that are apart from the second semiconductor regions and the third semiconductor regions, in a region between an active region through which a current flows during an on-state and an edge region that surrounds a periphery of the active region and sustains a breakdown voltage.

A further feature is that the semiconductor device according to the present invention described above has in the edge region, a fourth semiconductor region of the second conductivity type and a junction termination extension structure for enhancing the breakdown voltage; a distance between the fourth semiconductor region and the second semiconductor regions is at least equal to a distance between any adjacent two of the second semiconductor regions in the active region and less than a distance from the second semiconductor regions to the junction termination extension structure.

A further feature is that the semiconductor device according to the present invention described above has a fifth semiconductor region of the second conductivity type, selectively provided in the second semiconductor layer, the fifth semiconductor region being in contact with the first semiconductor region and having an impurity concentration that is higher than an impurity concentration of the second semiconductor layer; and in the region, the fifth semiconductor region is provided closer to the active region than are side surfaces of the second trench, that face the edge region.

DETAILED DESCRIPTION OF THE INVENTION

Figure 13:
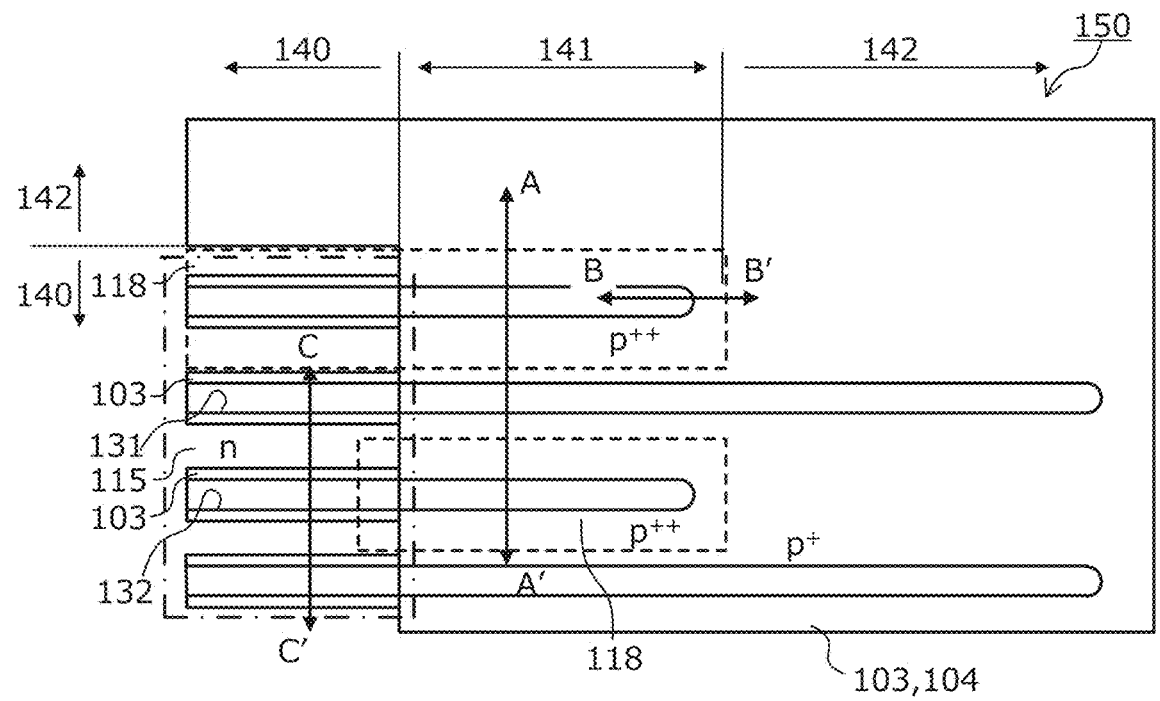
FIG. 13 is a top view depicting a structure of the conventional built-in SBD silicon carbide semiconductor device.
Figure 15:
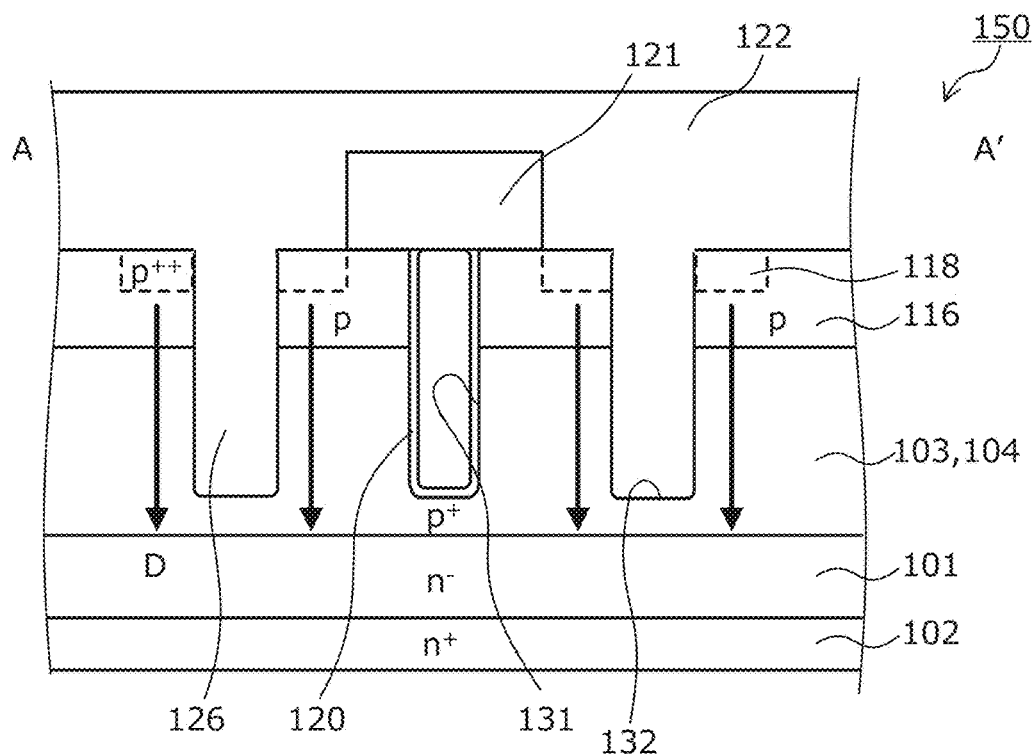
FIG. 15 is a cross-sectional view of a portion along A-A' in FIG. 13 depicting the structure of the conventional built-in SBD silicon carbide semiconductor device.
Figure 16:
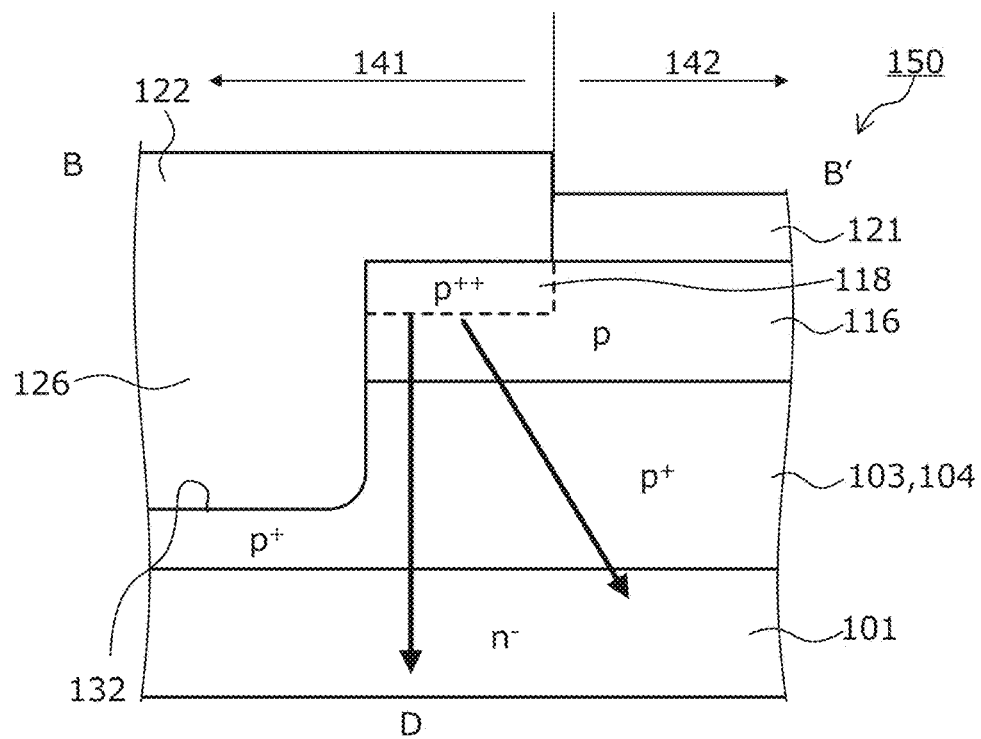
FIG. 16 is a cross-sectional view of a portion along B-B' in FIG. 13 depicting the structure of the conventional built-in SBD silicon carbide semiconductor device.

Problems to be addressed are discussed. FIG. 15 is a cross-sectional view of a portion along A-A' in FIG. 13 depicting the structure of the conventional built-in SBD silicon carbide semiconductor device. Further, FIG. 16 is a cross-sectional view of a portion along B-B' in FIG. 13 depicting the structure of the conventional built-in SBD silicon carbide semiconductor device. As depicted in FIG. 15 and FIG. 16, in the connecting region 141, the second $p^+$-type region 104 is provided on the first $p^+$-type region 103. Further, in a surface layer of the p-type base layer 116, the $p^{++}$-type contact regions 118 that are in contact with the trench SBDs 132 are provided. Therefore, in the connecting region 141, the trench SBDs 132 have a structure in which peripheries thereof are surrounded by p-type regions (the p-type base layer 116, the $p^{++}$-type contact regions 118, the first $p^+$-type region 103, and the second $p^+$-type region 104).

As a result, in the connecting region 141, the trench SBDs 132 do not function as a parasitic Schottky diode and bipolar operation of the parasitic pn diode cannot be inhibited. In an instance in which the parasitic pn diode turns on and conducts, due to the bipolar operation of the parasitic pn diode, hole current flows as indicated by a path D in FIG. 15 and FIG. 16, stacking faults are generated and expand due to energy generated by recombination by the hole current and electron current.

Therefore, the connecting region 141 has a problem in that characteristics change over time (degrade over time) to a greater extent than in the active region 140 due to the bipolar operation of the parasitic pn diode while increases in forward degradation and turn-on loss occur.

To solve the problems related to the conventional techniques above, one object of the present invention is to provide a semiconductor device capable of reducing forward voltage degradation and loss during turn-on.

Embodiments of a semiconductor device according to the present invention is described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
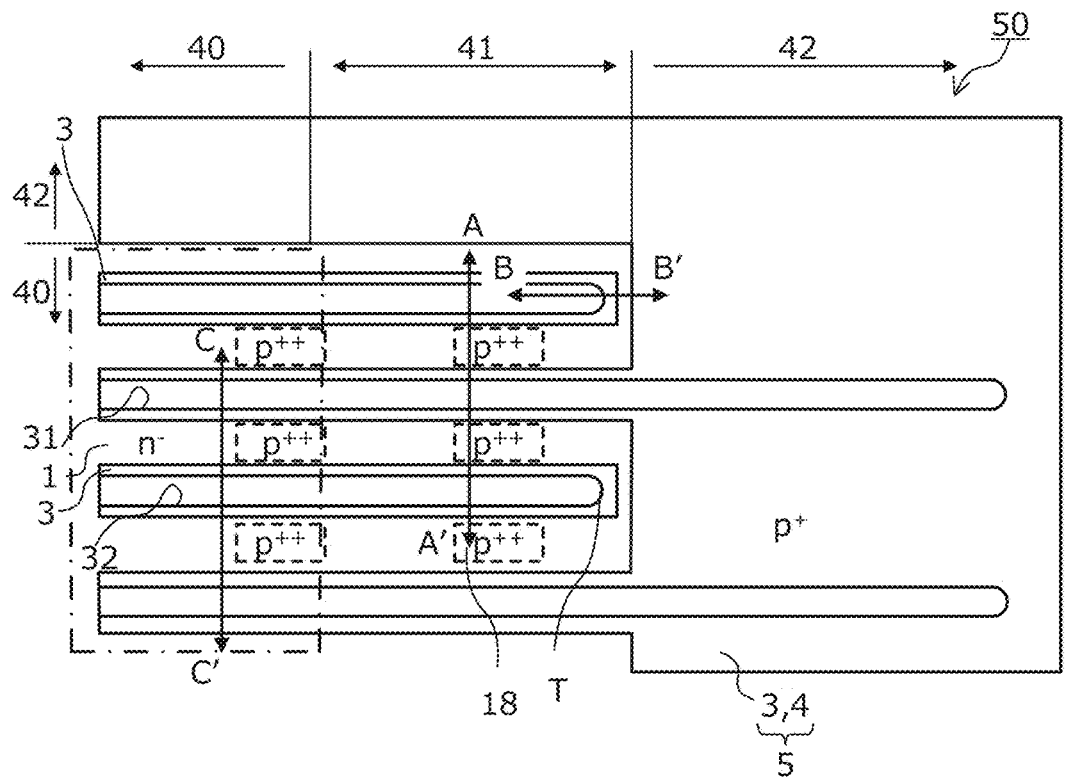
FIG. 1 is a top view depicting a structure of a silicon carbide semiconductor device according to an embodiment.
Figure 2:
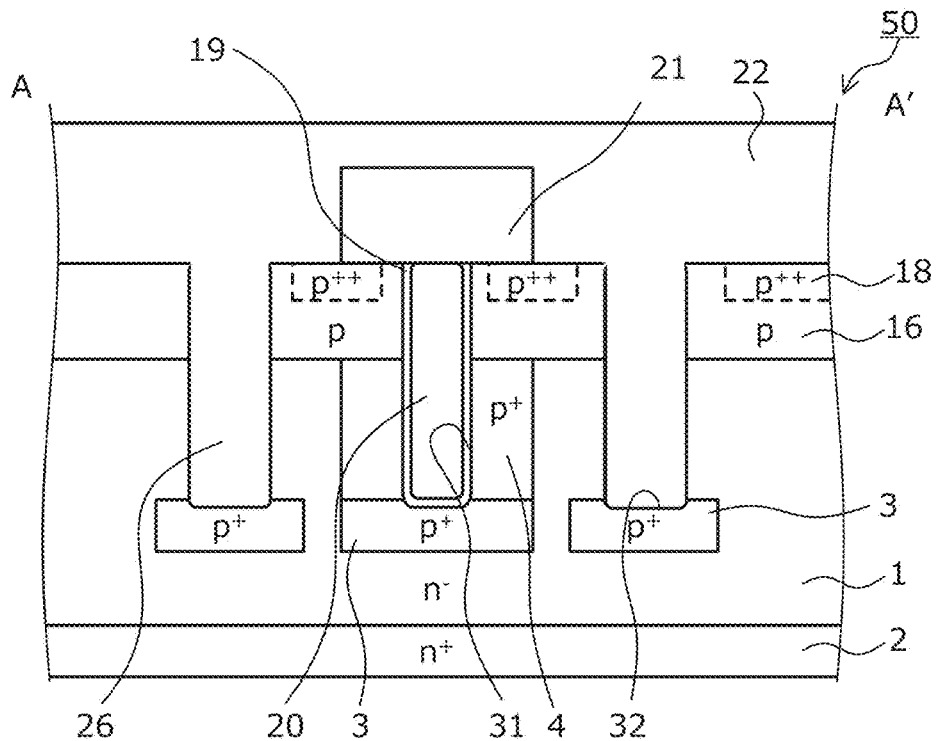
FIG. 2 is a cross-sectional view of a portion along A-A' in FIG. 1 depicting the structure of the silicon carbide semiconductor device according to the embodiment.
Figure 3:
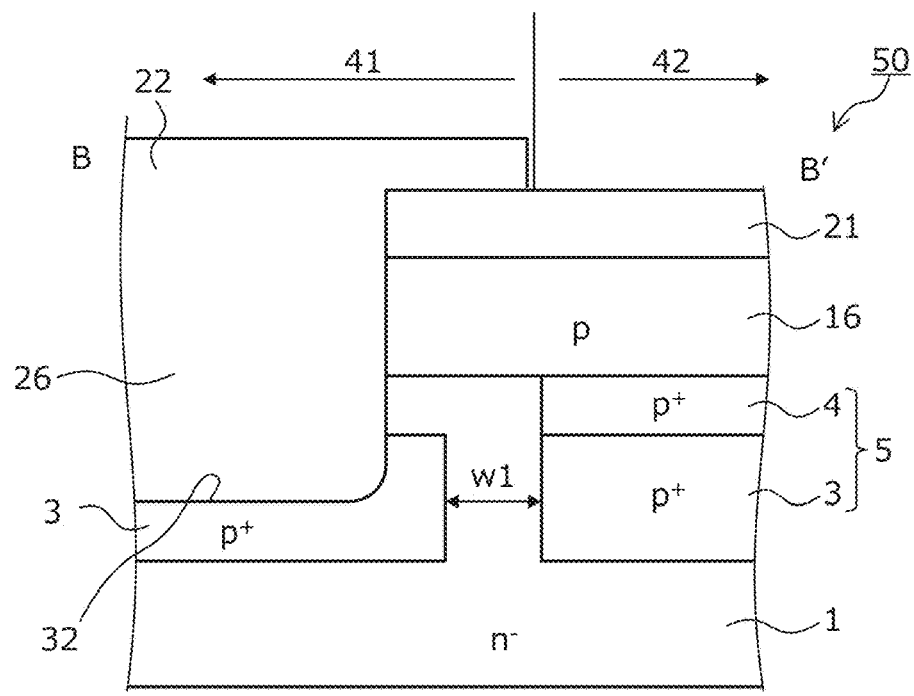
FIG. 3 is a cross-sectional view of a portion along B-B' in FIG. 1 depicting the structure of the silicon carbide semiconductor device according to the embodiment.
Figure 4:
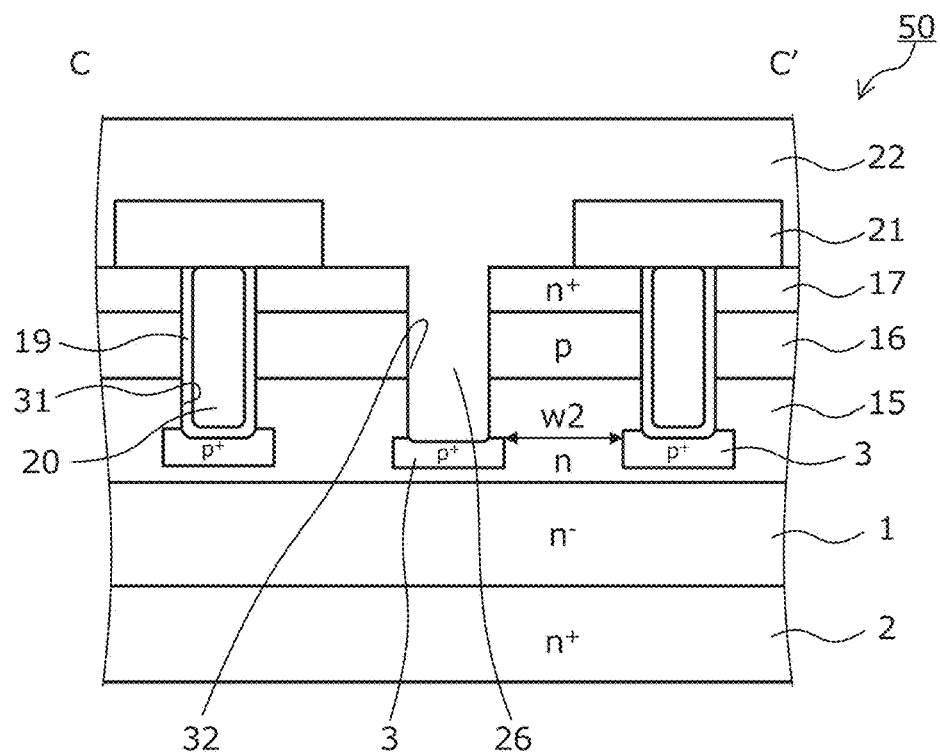
FIG. 4 is a cross-sectional view of a portion along C-C' in FIG. 1 depicting the structure of the silicon carbide semiconductor device according to the embodiment.

A semiconductor device according to the present invention is configured using a semiconductor having a band gap that is wider than that of silicon (hereinafter, wide band gap semiconductor). Herein, a structure of a semiconductor device (silicon carbide semiconductor device) in which, for example, silicon carbide (SiC) is used as a wide band gap semiconductor is described as an example. FIG. 1 is a top view depicting a structure of a silicon carbide semiconductor device according to an embodiment. FIG. 2 is a cross-sectional view of a portion along A-A' in FIG. 1 depicting the structure of the silicon carbide semiconductor device according to the embodiment. FIG. 3 is a cross-sectional view of a portion along B-B' in FIG. 1 depicting the structure of the silicon carbide semiconductor device according to the embodiment. FIG. 4 is a cross-sectional view of a portion along C-C' in FIG. 1 depicting the structure of the silicon carbide semiconductor device according to the embodiment.

As depicted in FIG. 1, a built-in SBD silicon carbide semiconductor device 50 is configured by an active region 40 in which a device element structure is formed and through which a main current passes in a thickness direction of the substrate during an on-state, an edge region 42 that surrounds a periphery of the active region 40 and sustains a breakdown voltage, and a connecting region 41 between the active region 40 and the edge region 42. The active region 40 is a region surrounded by a dotted and dashed line in FIG. 1. The connecting region 41, as depicted in FIG. 2, is a region that does not function as a MOS and in which side surfaces of later-described trench gates 31 are covered by p-type regions. In FIG. 2 and FIG. 3, only one unit cell (functional unit of device element) is depicted and other unit cells adjacent thereto are not depicted. The silicon carbide semiconductor device according to the embodiment depicted in FIGS. 1 to 3 is a MOSFET that includes MOS gates at a front surface (surface having a later-described p-type base layer 16) of a semiconductor base (silicon carbide base: semiconductor chip) containing silicon carbide.

The silicon carbide base is formed by sequentially growing, epitaxially on an n$^+$-type support substrate (semiconductor substrate of a first conductivity type) 2 containing silicon carbide, silicon carbide layers constituting an n$^−$-type drift layer (first semiconductor layer of the first conductivity type) 1 and a p-type base layer (second semiconductor layer of a second conductivity type) 16. In the active region 40, the MOS gates are configured by the p-type base layer 16, n$^+$-type source regions (first semiconductor regions of the first conductivity type) 17, a gate insulating film 19, and gate electrodes 20. In particular, in a surface layer of the n$^−$-type drift layer 1, the surface layer being on a source side (side facing later-described source electrode 22), an n-type region 15 may be provided so as to be in contact with the p-type base layer 16. The n-type region 15 is a so-called current spreading layer (CSL) that reduces carrier spreading resistance. The n-type region 15, for example, is provided uniformly in a direction parallel to a base front surface (the front surface of the silicon carbide base). In FIG. 2 and FIG. 3, the n-type region 15 is not depicted.

In the n-type region 15 (in an instance in which the n-type region 15 is omitted, the n$^−$-type drift layer 1, hereinafter, simply "(1)"), first p$^+$-type regions (second semiconductor regions of the second conductivity type) 3 are selectively provided. In the active region 40, the first p$^+$-type regions 3 are provided so as to be in contact with bottoms of the later-described trench gates (first trenches) 31 and bottoms of later-described trench SBDs (second trenches) 32. Further, in the surface layer of the n-type region 15 (1), second p$^+$-type regions (third semiconductor regions of the second conductivity type) 4 are selectively provided. The second p$^+$-type regions 4 are provided so that bottoms thereof are in contact with the first p$^+$-type regions 3.

In an instance in which the n-type region 15 is provided, the first p$^+$-type regions 3 are provided from a depth position closer to a drain than is an interface between the p-type base layer 16 and the n-type region 15 to a depth not reaching an interface between the n-type region 15 and the n$^−$-type drift layer 1. The first p$^+$-type regions 3 are provided, whereby near the bottoms of the trench SBDs 32 and the trench gates 31, pn junctions between the first p$^+$-type regions 3 and the n-type region 15 (1) may be formed. The first p$^+$-type regions 3 and the second p$^+$-type regions 4 have impurity concentrations higher than an impurity concentration of the p-type base layer 16.

Further, the n$^+$-type source regions 17 are selectively provided in the p-type base layer 16. The n$^+$-type source regions 17 and p$^{++}$-type contact regions (fifth semiconductor regions of the second conductivity type) 18 may be selectively provided so as to be in contact with one another. In this instance, the p$^{++}$-type contact regions 18 may have a depth that is, for example, the same as that of the n$^+$-type source regions 17 or deeper than that of the n$^+$-type source regions 17.

The trench gates 31 penetrate through the n$^+$-type source regions 17 and the p-type base layer 16 from the base front surface and reach the n-type region 15 (1). In the trench gates 31, the gate insulating film 19 is provided along sidewalls of the trench gates 31 and on the gate insulating film 19, the gate electrodes 20 are provided. The gate electrodes 20 have ends facing a source and the ends may protrude outward from the base front surface. The gate electrodes 20 are electrically connected to a gate electrode pad (not depicted). An interlayer insulating film 21 is provided in an entire area of the base front surface so as to cover the gate electrodes 20 embedded in the trench gates 31.

The trench SBDs 32 penetrate through the n$^+$-type source regions 17 and the p-type base layer 16 from the base front surface and reach the n-type region 15 (1). In the trench SBDs 32, sidewalls of the trench SBDs 32 are covered by a Schottky metal 26 connected to the source electrode 22 while semiconductor regions exposed at inner walls of the trench SBDs 32 and the Schottky metal 26 form Schottky barrier junctions. Further, an oxide film, for example, silicon dioxide (SiO$_2$) may be provided on the Schottky metal 26.

Here, as depicted in FIG. 1 and FIG. 3, in the edge region 42, a p$^+$-type region (a region that is combination of one of the first p$^+$-type regions 3 and one of the second p$^+$-type regions 4 is referred to as a p$^+$-type region, fourth semiconductor region of the second conductivity type) 5 is provided formed by one of the second p$^+$-type regions 4 on one of the first p$^+$-type regions 3. Further, as depicted in FIG. 1, the trench gates 31 extend to the edge region 42 to be connected to a gate runner (not depicted). As depicted in FIG. 2, to prevent the trench gates 31 from functioning as a MOS, in the connecting region 41, the sidewalls and the bottoms of the trench gates 31 are in contact with the first and the second p$^+$-type regions 3, 4.

On the other hand, as depicted in FIG. 1 to FIG. 3, in the connecting region 41, the sidewalls of the trench SBDs 32 are not in contact with the first and the second p$^+$-type regions 3, 4. In other words, in the conventional built-in SBD silicon carbide semiconductor device, a portion of the p$^+$-type region 5 that is embedded in a periphery of the trench SBDs 132 is opened, whereby the trench SBDs 32 of the embodiment are such that the sidewalls of the trench SBDs 32 are in contact with the n-type region 15 (1). As a result, even in the connecting region 41, the trench SBDs 32 may be caused to function as a parasitic Schottky diode. Therefore, when a negative bias is applied to a drain side of the built-in SBD silicon carbide semiconductor device, even in the connecting region 41, a parasitic Schottky diode is caused to operate, whereby bipolar operation of the parasitic pn diode may be inhibited and forward degradation as well as increases in turn-on loss may be suppressed.

Figure 5:
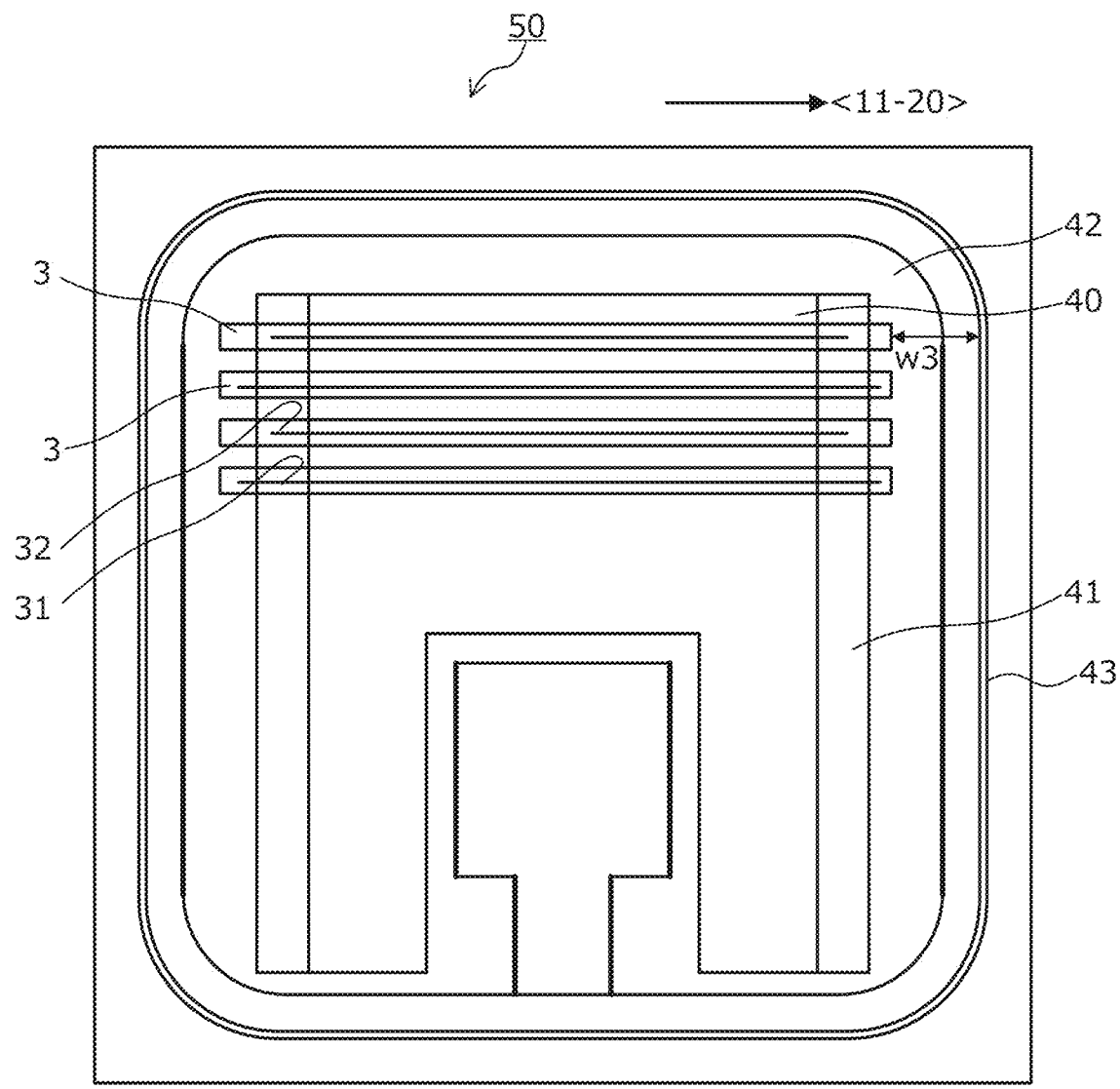
FIG. 5 is a top view depicting an appearance of the silicon carbide semiconductor device according to the embodiment.

FIG. 5 is a top view depicting an appearance of the silicon carbide semiconductor device according to the embodiment. As depicted in FIG. 5, the trench SBDs 32 and the trench gates 31 are provided in a striped pattern in a direction that is the crystal orientation <11-20> of an n$^+$-type silicon carbide substrate 2. In the edge region 42, a JTE region 43 is provided as a junction termination extension (JTE) structure for enhancing the overall breakdown voltage of the high-voltage semiconductor device by mitigating or distributing the electric field. Closer to a chip end than is the JTE region 43, an n$^+$-type semiconductor region (not depicted) functioning as a channel stopper is provided.

Figure 14:
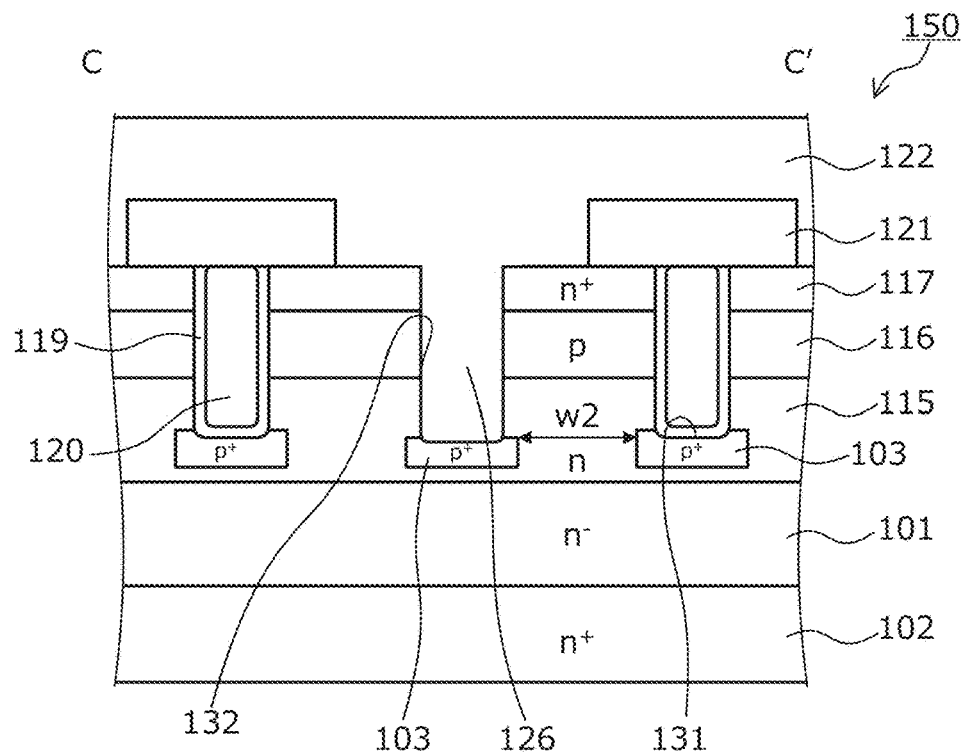
FIG. 14 is a cross-sectional view of a portion along C-C' in FIG. 13 depicting the structure of the conventional built-in SBD silicon carbide semiconductor device.

In the embodiment, preferably, a distance w1 between the p$^+$-type region 5 provided in the edge region 42 and one of the first p$^+$-type regions 3 provided at the bottoms of the trench SBDs 32 (refer to FIG. 3) may be at least equal to an interval w2 between any adjacent two of the first p$^+$-type regions 3 in the active region 40 (width of a JFET region, refer to FIG. 14). Preferably, the distance w1 may be less than a distance w3 from the first p$^+$-type regions 3 to the JTE region 43 (refer to FIG. 5). In this manner, in the embodiment, a breakdown voltage about equal to that conventionally may be maintained.

Further, in the conventional built-in SBD silicon carbide semiconductor device, in the connecting region 141, the p$^{++}$-type contact regions 118 are provided in a surface layer of the p-type base layer 116 and surround the sidewalls of the trench SBDs 132 (refer to FIG. 13, FIG. 15, FIG. 16). As a result, the parasitic pn diode easily operates in the connecting region 141. In contrast, in the embodiment, when the p$^{++}$-type contact regions 18 are provided, as depicted in FIG. 1, in the connecting region 41, the p$^{++}$-type contact regions 18 are positioned closer to a chip center (the active region 40 side) than are side surfaces of the trench SBDs 32, that face on the edge region 42. As a result, a structure in which the p$^{++}$-type contact regions 18, the p-type base layer 16, and the n$^-$-type drift layer 1 are arranged vertically relative to one another is absent and operation of the parasitic pn diode in the connecting region 41 is suppressed.

The source electrode 22 is in contact with the n$^+$-type source regions 17 via contact holes opened in the interlayer insulating film 21 and is electrically insulated from the gate electrodes 20 by the interlayer insulating film 21. In an instance in which the p$^{++}$-type contact regions 18 are provided, the source electrode 22 is further in contact with the p$^{++}$-type contact regions 18. Between the source electrode 22 and the interlayer insulating film 21, for example, a barrier metal that prevents diffusion of metal atoms from the source electrode 22 to the gate electrodes 20 may be provided. On the source electrode 22, a source electrode pad (not depicted) is provided. On a back surface (back surface of the n$^+$-type silicon carbide substrate 2 constituting an n$^+$-type drain region) of the silicon carbide semiconductor device 50, a drain electrode (not depicted) is provided.

Figure 6:
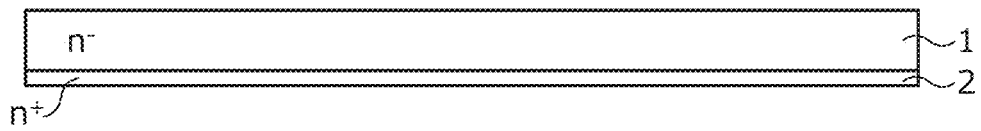
FIG. 6 is a cross-sectional view depicting a state of the silicon carbide semiconductor device according to the embodiment during manufacture (part 1).

Next, a method of manufacturing the semiconductor device according to the embodiment is described. FIGS. 6, 7, 8, 9, and 10 are cross-sectional views depicting states of the silicon carbide semiconductor device according to the embodiment during manufacture. First, the n$^+$-type silicon carbide substrate 2 that constitutes the n$^+$-type drain region is prepared. Next, on the front surface of the n$^+$-type silicon carbide substrate 2, the n$^-$-type drift layer 1 described above is epitaxially grown. For example, conditions of the epitaxial growth for forming the n$^-$-type drift layer 1 may be set so that the impurity concentration of the n$^-$-type drift layer 1 becomes about $3\times10^{15}/cm^3$. The state up to here is depicted in FIG. 6.

Figure 7:
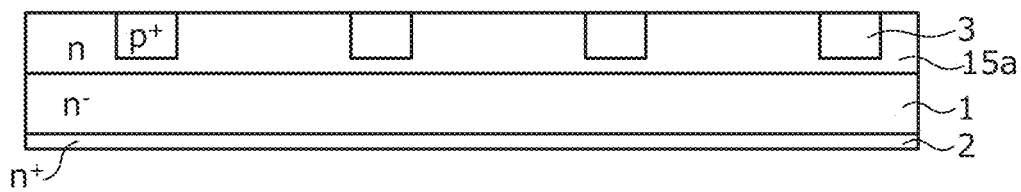
FIG. 7 is a cross-sectional view depicting a state of the silicon carbide semiconductor device according to the embodiment during manufacture (part 2).

Next, on the n$^-$-type drift layer 1, a lower n-type region 15$a$ (in an instance in which the n-type region 15 is not formed, an n-type layer of an impurity of about the same as that of the n$^-$-type drift layer 1, hereinafter, simply "n-type layer") is epitaxially grown. For example, conditions of the epitaxial growth for forming the lower n-type region 15$a$ may be set so that the impurity concentration of the lower n-type region 15$a$ becomes about $1\times10^{17}/cm^3$. The lower n-type region 15$a$ is a portion of the n-type region 15. Next, by photolithography and ion implantation of a p-type impurity, the first p$^+$-type regions 3 are selectively formed in a surface layer of the lower n-type region 15$a$ (the n-type layer). For example, a dose amount during the ion implantation for forming the first p$^+$-type regions 3 may be set so that the impurity concentration becomes about $5\times10^{18}/cm^3$. Similarly, the first p$^+$-type regions 3 are selectively formed in the connecting region 41 and the edge region 42 as well. The state up to here is depicted in FIG. 7.

Figure 8:
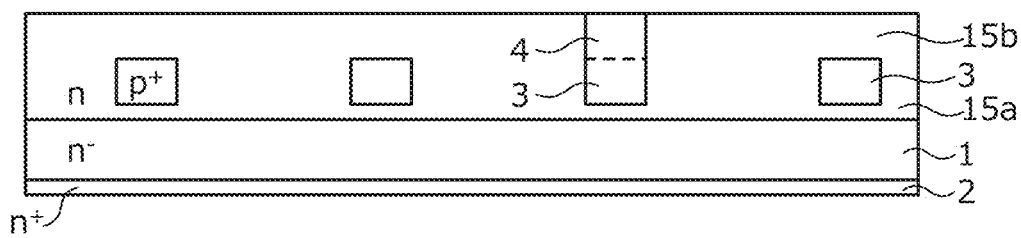
FIG. 8 is a cross-sectional view depicting a state of the silicon carbide semiconductor device according to the embodiment during manufacture (part 3).

Next, on the lower n-type region 15$a$ (the n-type layer) and the first p$^+$-type regions 3, an upper n-type region 15$b$ (n-type layer) is epitaxially grown. For example, conditions of the epitaxial growth for forming the upper n-type region 15$b$ may be set so that the impurity concentration of becomes about the same as the impurity concentration of the lower n-type region 15$a$. The upper n-type region 15$b$ is a portion of the n-type region 15 and the lower n-type region 15$a$ and the upper n-type region 15$b$ combined constitute the n-type region 15. Next, by photolithography and ion implantation of a p-type impurity, the second p$^+$-type regions 4 are selectively formed in a surface layer of the upper n-type region 15$b$ (the n-type layer). For example, a dose amount during the ion implantation for forming the second p$^+$-type regions 4 may be set so that the impurity concentration becomes about the same as that of the first p$^+$-type regions 3. A region that is a combination of one of the first p$^+$-type regions 3 and one of the second p$^+$-type regions 4 is referred to as "the first, the second p$^+$-type regions 3, 4". Similarly, the second p$^+$-type regions 4 are selectively formed in the connecting region 41 and the edge region 42 as well. When the second p$^+$-type regions 4 are formed, in the connecting region 41, the second p$^+$-type regions 4 are formed so as to be apart from the sidewalls of the trench SBDs 32. The state up to here is depicted in FIG. 8.

Next, the p-type base layer 16 is epitaxially grown on the upper n-type region 15b and the second p$^+$-type regions 4. For example, conditions of the epitaxial growth for forming the p-type base layer 16 may be set so that the impurity concentration of the p-type base layer 16 becomes about $4 \times 10^{17}/\text{cm}^3$.

Next, by photolithography and ion implantation of an n-type impurity, the n$^+$-type source regions 17 are selectively formed in a surface layer of the p-type base layer 16. For example, a dose amount during the ion implantation for forming the n$^+$-type source regions 17 may be set so that the impurity concentration becomes about $3 \times 10^{20}/\text{cm}^3$.

Figure 9:
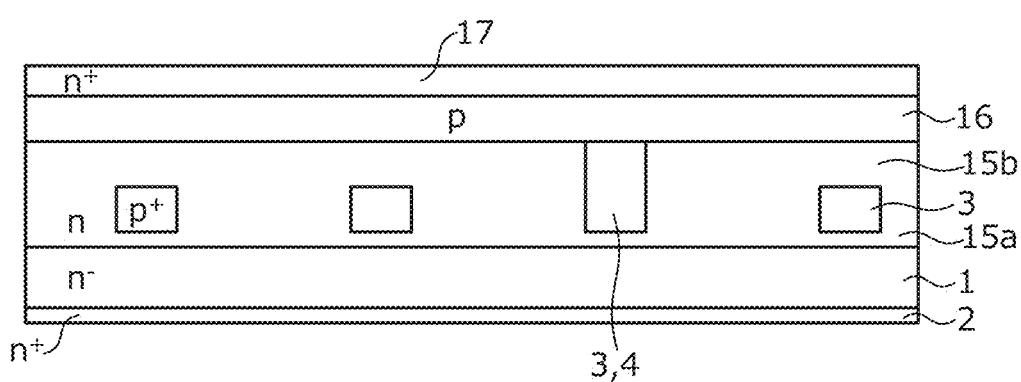
FIG. 9 is a cross-sectional view depicting a state of the silicon carbide semiconductor device according to the embodiment during manufacture (part 4).

Next, by photolithography and ion implantation of a p-type impurity, in the surface layer of the p-type base layer 16, the p$^{++}$-type contact regions 18 may be selectively formed so as to be in contact with the n$^+$-type source regions 17. For example, a dose amount during the ion implantation for forming the p$^{++}$-type contact regions 18 may be set so that the impurity concentration becomes about $3 \times 10^{20}/\text{cm}^3$. The sequence in which the n$^+$-type source regions 17 and the p$^{++}$-type contact regions 18 are formed may be interchanged. Next, by photolithography and ion implantation of a p-type impurity, the JTE region 43 is formed in the edge region 42. After all the ion implantations are completed, activation annealing is performed. The state up to here is depicted in FIG. 9.

Next, by photolithography and etching, the trench gates 31 that penetrate through the n$^+$-type source regions 17 and the p-type base layer 16 and reach the n-type region 15 (1) are formed. The bottoms of the trench gates 31 may reach the first p$^+$-type regions 3 or may be positioned in the n-type region 15 (1), between the p-type base layer 16 and the first p$^+$-type regions 3. Subsequently, a mask used to form the trench gates 31 is removed. Further, an oxide film is used as the mask during trench formation. Further, after the trench etching, isotropic etching for removing damage of the trench gates 31 and hydrogen annealing for rounding corners of openings of the trench gates 31 and the bottoms of the trench gates 31 may be performed. The isotropic etching or the hydrogen annealing alone may be performed. Further, the hydrogen annealing may be performed after the isotropic etching is performed.

Figure 10:
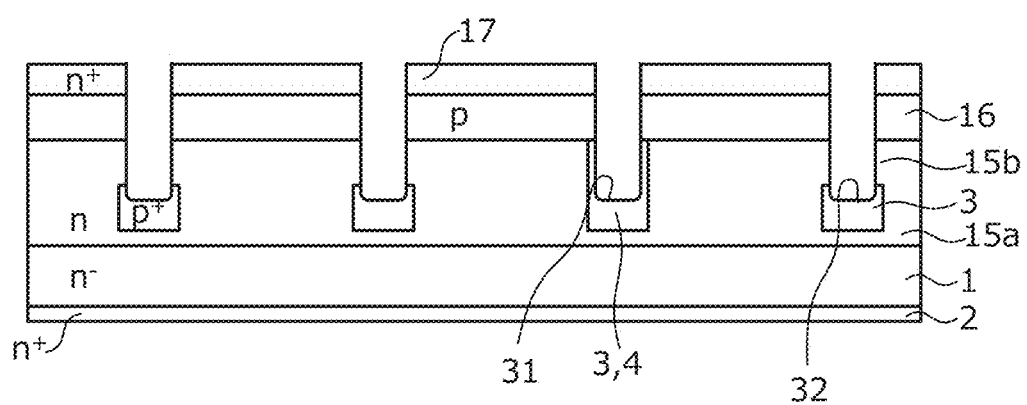
FIG. 10 is a cross-sectional view depicting a state of the silicon carbide semiconductor device according to the embodiment during manufacture (part 5).

Next, by photolithography and etching, the trench SBDs 32 that penetrate through the n$^+$-type source regions 17 and the p-type base layer 16 and reach the n-type region 15 (1) are formed. The bottoms of the trench SBDs 32 may reach the first p$^+$-type regions 3 or may be positioned in the n-type region 15 (1), between the p-type base layer 16 and the first p$^+$-type regions 3. Subsequently, a mask used to form the trench SBDs 32 is removed. At this time, formation is such that the distance w1 from an end T of each of the trench gates 31 to the p$^+$-type region 5 is at least equal to the interval w2 between the trench gates 31 and the distance w1 is less than the distance w3 from the first p$^+$-type regions 3 to the JTE region 43. The state up to here is depicted in FIG. 10.

Next, the gate insulating film 19 is formed along the front surface of the silicon carbide base and inner walls of the trench gates 31. Next, for example, a polysilicon is deposited so as to be embedded in the trench gates 31 and is etched so as to be left in the trench gates 31 as the gate electrodes 20. At this time, the polysilicon may be etched so as to be left below the base surface or may be patterned and etched so as to be left protruding outward from the base surface.

Next, a metal film containing, for example, titanium (Ti) is formed along the inner walls of the trench SBDs 32. Next, for example, a heat treatment (annealing) is performed under a nitrogen (N$_2$) atmosphere of a temperature of about 500 degrees C., whereby Schottky barrier junctions of the semiconductor regions and the metal film are formed on the inner walls of the trench SBDs 32.

Next, the interlayer insulating film 21 is formed on an entire area of the front surface of the silicon carbide base so as to cover the gate electrodes 20. The interlayer insulating film 21 is formed by, for example, a non-doped silicate glass (NSG), a phosphorsilicate glass (PSG), a borophosphosilicate (BPSG), a high temperature oxide (HTO), or a combination thereof. Next, the interlayer insulating film 21 and the gate insulating film 19 are patterned, thereby forming contact holes and exposing the n$^+$-type source regions 17. In an instance in which the p$^{++}$-type contact regions 18 are formed, the n$^+$-type source regions 17 and the p$^{++}$-type contact regions 18 are exposed.

Next, the barrier metal is formed so as to cover the interlayer insulating film 21 and is patterned, thereby again exposing the n$^+$-type source regions 17 and the p$^{++}$-type contact regions 18. Next, the source electrode 22 is formed so as to cover the n$^+$-type source regions 17. The source electrode 22 may be formed so as to cover the barrier metal or may be left only in the contact holes.

Next, the source electrode pad is formed so as to be embedded in the contact holes. A portion of a metal layer deposited to form the source electrode pad may constitute the gate electrode pad. On the back surface of the n$^+$-type silicon carbide substrate 2, a metal film such as a nickel (Ni) film, a titanium (Ti) film, etc. is formed in a contact portion of the drain electrode using sputtering deposition or the like. The metal film may be a combination of stacked layers of Ni films and Ti films. Thereafter, annealing such as a rapid heat treatment (rapid thermal annealing (RTA)) is performed so as to convert the metal film into a silicide and thereby form an ohmic contact. Thereafter, for example, a thick film such as a stacked film sequentially containing a Ti film, a Ni film, and a gold (Au) film is formed by electron beam (EB) deposition or the like, thereby forming the drain electrode.

In the epitaxial growth and the ion implantations described above, as an n-type impurity (n-type dopant), for example, nitrogen (N), phosphorus (P) arsenic (As), antimony (Sb), etc. that are n-types with respect to silicon carbide may be used. As a p-type impurity (p-type dopant), for example, boron (B), aluminum (Al), gallium (Ga), indium (In), thallium (TI), etc. that are p-types with respect to silicon carbide may be used. In this manner, the MOSFET depicted in FIG. 1 to FIG. 4 is completed.

Figure 11:
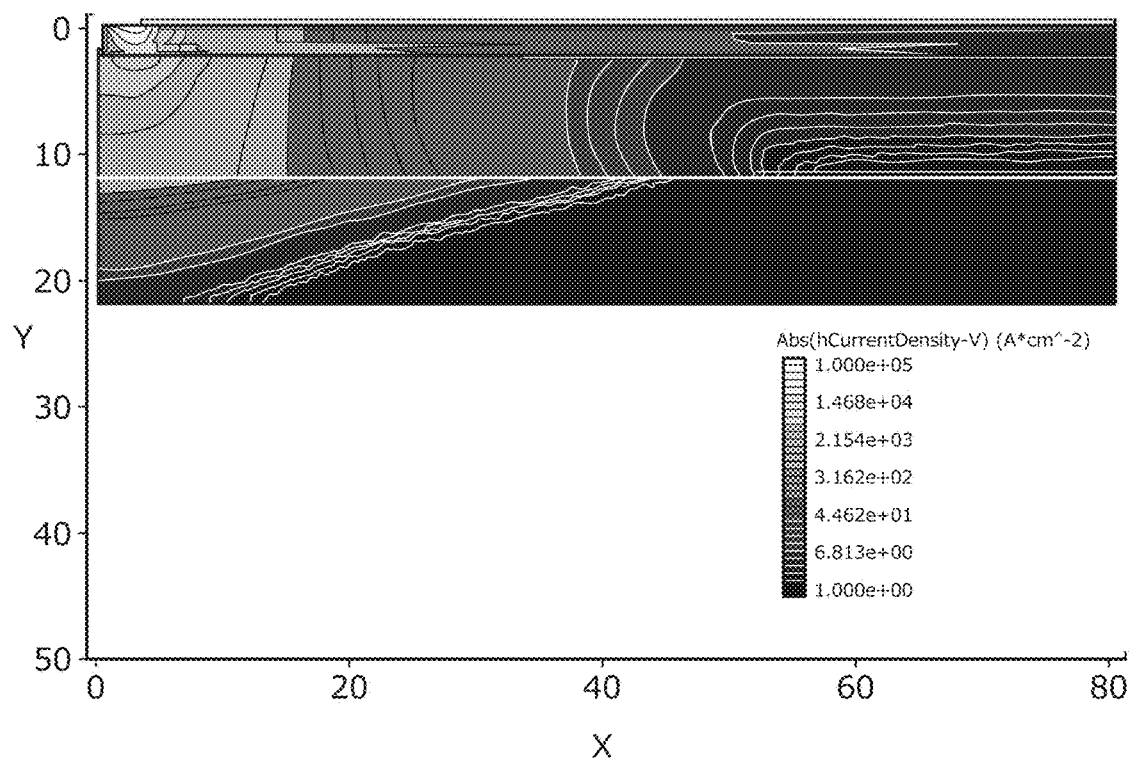
FIG. 11 is a diagram depicting hole current density of a conventional built-in SBD silicon carbide semiconductor device.
Figure 12:
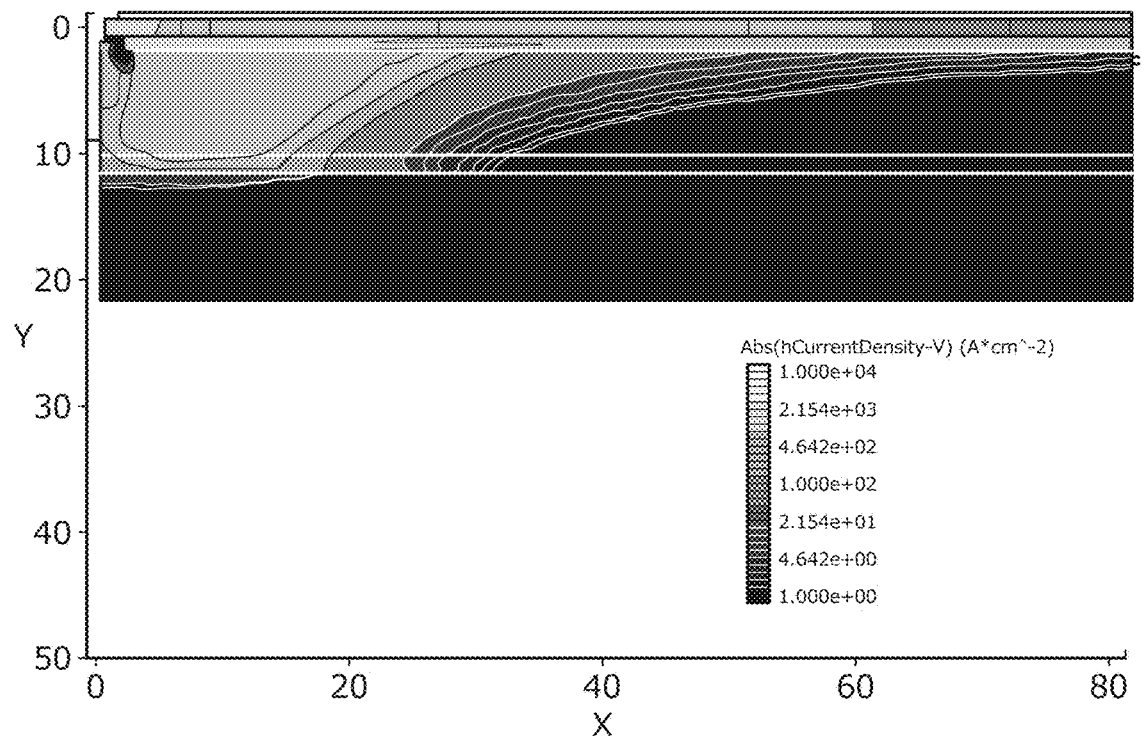
FIG. 12 is a diagram depicting hole current density of the silicon carbide semiconductor device according to the embodiment.

FIG. 11 is a diagram depicting hole current density of the conventional built-in SBD silicon carbide semiconductor device. FIG. 12 is a diagram depicting hole current density of the silicon carbide semiconductor device according to the embodiment. FIG. 11 and FIG. 12 show results of simulation of hole current density under a state of reverse bias at a temperature of 150 degrees C., where Vds=−5V. In FIG. 11 and FIG. 12, vertical axes represent the depth from the front surface of the silicon carbide base in units of μm. Further, horizontal axes represent the length from the ends of the trench SBDs 32 of the active region 40 ("T" in FIG. 1) in units of μm.

As depicted in FIG. 11 and FIG. 12, in the silicon carbide semiconductor device according to the embodiment, the hole current density of the connecting region 41 is significantly lower than that in the conventional built-in SBD silicon carbide semiconductor device. Therefore, in the silicon carbide semiconductor device according to the embodiment, the amount of holes entering the n$^+$-type silicon carbide substrate 2 is reduced, whereby the occurrence and expansion of stacking faults may be inhibited.

As described above, according to the embodiment, in the connecting region 41, the sidewalls of the trench SBDs are apart from the first and the second p+-type regions. As a result, even in the connecting region 41, the trench SBDs may be caused to function as parasitic Schottky diodes. Therefore, when negative bias is applied to the drain side of the built-in SBD silicon carbide semiconductor device, even in the connecting region 41, parasitic Schottky diodes are caused to operate, whereby bipolar operation of the parasitic pn diodes may be inhibited, thereby enabling suppression of forward degradation and suppression of increases in turn-on loss.

In the foregoing, the present invention may be variously modified within a range not departing from the spirit of the invention and in the embodiments described above, for example, dimensions, impurity concentrations, etc. of parts may be variously set according to necessary specifications. Further, in the described embodiments, while a MOSFET is described as an example, without limitation hereto, application is further possible to various types of silicon carbide semiconductor devices that conduct and block current by gate-driven control based on a predetermined gate threshold. Gate-driven controlled silicon carbide semiconductor devices, for example, include insulated gate bipolar transistor (IGBTs) and the like. Further, in the embodiments described, while an instance in which silicon carbide is used as a wide band gap semiconductor is described as an example, a wide band gap semiconductor other than silicon carbide such as, for example, gallium nitride (GaN) is applicable. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, in the connecting region, the sidewalls of the trench SBDs (second trenches) are apart from the first and the second p+-type regions (second and third semiconductor regions of the second conductivity type). As a result, even in the connecting region, the trench SBDs may be caused to function as parasitic Schottky diodes. Therefore, when negative bias is applied to the drain side of the built-in SBD silicon carbide semiconductor device, even in the connecting region, bipolar operation of the parasitic pn diodes may be inhibited by the operation of the parasitic Schottky diodes and forward degradation and increases in turn-on loss may be suppressed.

The semiconductor device according to the present invention achieves an effect in that forward voltage degradation and loss during turn-on may be reduced.

As described above, the semiconductor device according to the present invention is useful for power semiconductor devices used in power converting equipment, power source devices of various types of industrial machines, etc. and is particularly suitable for silicon carbide semiconductor devices having a trench gate structure.

REFERENCE CHARACTERS 1, 101 n−-type drift layer
2, 102 n+-type silicon carbide substrate
3, 103 first p+-type region
4, 104 second p+-type region
5 p+-type region
15, 115 n-type region
15a lower n-type region
15b upper n-type region
16, 116 p-type base layer
17, 117 n+-type source region
18, 118 p++-type contact region
19, 119 gate insulating film
20, 120 gate electrode
21, 121 interlayer insulating film
22, 122 source electrode
26, 126 Schottky metal
31, 131 trench gate
32, 132 trench SBDs
40, 140 active region
41, 141 connecting region
42, 142 edge region
43 JTE region
50, 150 built-in SBD silicon carbide semiconductor device

What is claimed is:

1. A semiconductor device, comprising:
a semiconductor substrate of a first conductivity type;
a first semiconductor layer of the first conductivity type provided on a front surface of the semiconductor substrate, wherein the first semiconductor layer has an impurity concentration that is lower than an impurity concentration of the semiconductor substrate;
a second semiconductor layer of a second conductivity type provided on a side of the first semiconductor layer, that is opposite to a side of the first semiconductor layer, that faces the semiconductor substrate;
a first semiconductor region of the first conductivity type selectively provided in the second semiconductor layer, wherein the first semiconductor region has an impurity concentration that is higher than the impurity concentration of the first semiconductor layer;
a plurality of second semiconductor regions of the second conductivity type provided in the first semiconductor layer;
a plurality of third semiconductor regions of the second conductivity type provided from a surface of the first semiconductor layer and having bottoms in contact with the plurality of second semiconductor regions;
a first trench and a second trench that penetrate the first semiconductor region and the second semiconductor layer and reach the first semiconductor layer, respective bottoms of the first trench and the second trench being in contact with the plurality of second semiconductor regions, respectively;
a gate electrode provided in the first trench via a gate insulating film; and
a Schottky electrode provided in the second trench, wherein
the second trench has sidewalls that are apart from the plurality of second semiconductor regions and the plurality of third semiconductor regions, in a region between an active region through which a current flows during an on-state and an edge region that surrounds a periphery of the active region and sustains a breakdown voltage.

2. The semiconductor device according to claim 1, further comprising:
a fourth semiconductor region of the second conductivity type provided in the edge region; and
a junction termination extension structure for enhancing the breakdown voltage provided in the edge region, wherein
a distance between the fourth semiconductor region and the plurality of second semiconductor regions is at least equal to a distance between adjacent two among the plurality of second semiconductor regions in the active region and less than a distance from the plurality of second semiconductor regions to the junction termination extension structure.

3. The semiconductor device according to claim 1, further comprising a fifth semiconductor region of the second conductivity type selectively provided in the second semiconductor layer, the fifth semiconductor region being in contact with the first semiconductor region and having an impurity concentration that is higher than an impurity concentration of the second semiconductor layer, wherein in the region, the fifth semiconductor region is provided closer to the active region than are side surfaces of the second trench, that face the edge region.

* * * * *